United States Patent
Haugan et al.

(10) Patent No.: US 6,400,459 B1
(45) Date of Patent: Jun. 4, 2002

(54) METHODS AND APPARATUS FOR USING OPTICAL SENSORS IN COMPONENT REPLACEMENT HEADS

(75) Inventors: Carl E. Haugan, Saint Paul; Bruce Peterson, Plymouth, both of MN (US); Jan T. A. van de Ven, Einhover (NL)

(73) Assignee: CyberOptics Corp., Minneapolis, MN (US)

( * ) Notice: Subject to any disclaimer, the term of this patent is extended or adjusted under 35 U.S.C. 154(b) by 0 days.

(21) Appl. No.: 09/339,598

(22) Filed: Jun. 24, 1999

Related U.S. Application Data (63) Continuation of application No. 08/919,483, filed on Aug. 28, 1997, now abandoned, which is a continuation of application No. 08/394,336, filed on Feb. 24, 1995, now abandoned.

(51) Int. Cl.[7] .......................... G01B 11/14; G01B 11/00
(52) U.S. Cl. ...................... 356/614; 356/638; 356/625; 356/613; 356/400; 356/138
(58) Field of Search .................................. 356/614, 613, 356/620, 625, 638, 138, 400; 250/559.29, 560

(56) References Cited

U.S. PATENT DOCUMENTS

| | | |
|---|---|---|
| 3,636,635 A | 1/1972 | Lemelson |
| 3,854,052 A | 12/1974 | Asar et al. |
| 3,905,705 A | 9/1975 | Petrohilos |
| 4,074,938 A | 2/1978 | Taylor |
| 4,456,378 A | 6/1984 | Goldowsky et al. |
| 4,585,350 A | 4/1986 | Pryor |
| 4,615,093 A | 10/1986 | Tews et al. |
| 4,741,621 A | 5/1988 | Taft et al. |
| 4,812,666 A | 3/1989 | Wistrand |
| 5,005,978 A | 4/1991 | Skunes et al. |
| 5,046,851 A | 9/1991 | Morgan |

(List continued on next page.)

FOREIGN PATENT DOCUMENTS

| | | |
|---|---|---|
| EP | 0 582 171 A1 | 2/1994 |
| GB | 2183820 A | 6/1987 |
| JP | 2303751 | 12/1990 |
| JP | 6-104596 | 4/1994 |
| SU | 1370456 | 1/1988 |

OTHER PUBLICATIONS

Case, Dr. Steven K., "Laser Vision Adds Precision and Speed to Component Placement Machines," presented at NEPCON West '93, 1993.

*Primary Examiner*—Frank G. Font
*Assistant Examiner*—Layla Lauchman
(74) *Attorney, Agent, or Firm*—Dicke, Billig & Czaja P.A.

(57) ABSTRACT

Methods and apparatus for improving the efficiency of using optical sensors with component placement machines for the placement of components onto a circuit board. One of the improved methods involves the placement of a projection or notch at a selected position on the quill. The projection or notch is detected by the light based component sensor system on the placement head to indicate that it is safe to begin moving the placement head. A second improved method uses a constant, high angular velocity to rotate the component when the sensor is using the shadow cast by the body of the component to align the component. The use of a constant angular velocity allows for the correction for the rotation in determining the orientation to give very accurate results even though the velocity is relatively high. In a further improvement, the information used to determine the position of the component on the quill is used to calculate the dimensions of the component for comparison with expected dimensions of the component. Also, measurements taken without a component in the light path can be used to monitor the condition of the sensor to determine if maintenance is required or recommended.

19 Claims, 5 Drawing Sheets

U.S. PATENT DOCUMENTS

| | | |
|---|---|---|
| 5,114,229 A | 5/1992 | Hideshima |
| 5,162,866 A | 11/1992 | Tomiya et al. |
| 5,278,634 A | 1/1994 | Skunes et al. |
| 5,293,048 A | 3/1994 | Skunes et al. |
| 5,309,223 A | 5/1994 | Konicek et al. |
| 5,331,406 A | 7/1994 | Fishbaine et al. |
| 5,467,186 A | 11/1995 | Indo et al. |
| 5,566,447 A | 10/1996 | Sakurai |
| 5,570,993 A | 11/1996 | Onodera et al. |
| 5,608,642 A | 3/1997 | Onodera |
| 5,619,328 A | 4/1997 | Sakurai |
| 5,660,519 A | 8/1997 | Ohta et al. |
| 5,745,241 A | 4/1998 | Hashimoto |
| 5,749,142 A | 5/1998 | Hanamura |
| 5,897,611 A * | 4/1999 | Case et al. .................. 702/150 |
| 5,956,149 A * | 9/1999 | Suzuki et al. ............... 356/375 |
| 6,118,538 A * | 9/2000 | Haugen et al. ............. 356/375 |
| 6,195,165 B1 * | 2/2001 | Sayegh ....................... 356/376 |

* cited by examiner

METHODS AND APPARATUS FOR USING OPTICAL SENSORS IN COMPONENT REPLACEMENT HEADS

This is a Continuation of application Ser. No. 08/919,483 Aug. 28, 1997, now abandoned, which is a File Wrapper Continuation of application No. 08/394,336 filed Feb. 24, 1995, now abandoned.

FIELD OF THE INVENTION

The invention relates to optical sensor systems which precisely determine the correct angular orientation and lateral position of a component for precise placement of a component on a work surface by a component placement machine. More specifically, the invention relates to methods and apparatus for more efficiently aligning and placing components using optical component sensor systems.

BACKGROUND OF THE INVENTION

Circuit boards that carry integrated electronic circuits as well as discrete electronic components are well known. To properly place an integrated circuit or other component on a circuit board, the leads of the component must be aligned to corresponding pads on the circuit board within a specified tolerance. The pattern of the pads on the circuit board is determined by the function of the circuit board and is designed on the circuit board prior to assembly.

The separation between centers of any pair of adjacent leads on electronic components is referred to as the pitch. Currently, a commonly manufactured lead separation is 0.025 inches (25 mil) pitch, meaning that the center of the leads are spaced at 25 thousandths of an inch intervals. Advances in component manufacturing technology, however, have produced integrated circuits having 15 and 10 mil pitches and tape automated bonding (TAB) components have been created having several hundred leads spaced with a 4 mil pitch. The bottom ends of the leads form a seating plane that will meet the plane formed by the pads on the circuit board when the component is placed in position.

The dimensions of components placed on circuit boards normally vary between 0.02 inch and 2.0 inches, although larger components may need to be accommodated. For quality manufacturing, component leads must be placed with at least 80% overlap of the lead onto the corresponding pad of the circuit board. For example, a device having a 20 mil pitch generally has 10 mil wide leads. With an 80% overlap, at least 8 mils of the lead width must be on the pad with no more than 2 mils of the lead width off the pad. In general, sensing systems used to align parts for placement must have five to ten times better resolution than the accuracy required. Therefore, 0.2 to 0.4 mil image resolution is required to achieve the maximum placement error of 2 mils specified for quality manufacturing methods for a component with 20 mil pitch. Correspondingly smaller image resolution is required for components with smaller pitch.

To perform this delicate task, precision surface mount component placement machines have been developed. While the particular design of the component placement machine is not relevant, all component placement machines generally pick up a component at one location, properly orient the component and place the component in its proper location on the circuit board. The components are not precisely aligned in the component bins where they are picked up. Therefore, components may be out of position by as much as plus or minus 50 mils and plus or minus 5 degrees angular orientation. To obtain proper placement, the orientation and lateral position of the components from the bins must be determined and then corrected prior to placement.

In a surface mount component placement machine, a component placement head picks up the component from a component bin utilizing a vacuum quill. The vacuum gently picks up the component to be placed and transports it between the component bins and the circuit board. A transport arm moves the placement head with the vacuum quill and the component from the bin to a circuit board located on a work table. Sometime during transport, the angular orientation of the component and the offset of the component from the center of the quill must be determined. The vacuum quill is then precisely lowered to fit the component on the circuit board. In current component placement machines, the transport arm and quill move at approximately one meter per second.

Assuming that the leads of the component have not been damaged, the position of the leads are known from the position and orientation of the body of the component. Therefore, if the lateral position and orientation of the body of the component are determined, the component can be properly placed. Alternatively, systems have been developed that can perform measurements on the leads of the component to adjust for irregularities in the leads during placement and to discover and reject damaged components prior to placement.

Mechanical systems have been commonly used to obtain correct angular orientation and lateral positioning of a component on the end of a quill. The mechanical contacting of the component can cause damage to the components. It is also extremely difficult to achieve the very high degree of accuracy both as to angular orientation and lateral position that is required by the design rules in use in today's technology where lead spacing and widths are often only 10–25 mils wide. Therefore, non-contact, higher accuracy methods are desirable.

Conventional vision systems used in conjunction with component placement machines use solid state television cameras having a resolution of 512×512 picture elements or pixels. When viewing a two inch component, a corresponding two inch field of view with 512 elements produces a basic resolution of 4 mils or 4 thousandths of an inch. This is not sufficient resolution and, in fact, as pointed out above, it is necessary to achieve a resolution which is at least an order of magnitude greater. One solution is to use several cameras, but the use of several cameras is expensive.

Light based systems utilizing one or more focused light sources have been proposed which align a component by making a measurement of a shadow cast by the body of the component. U.S. Pat. No. 4,615,093, entitled Method and an Apparatus for the Positioning of Components With Reference to a Workpiece, describes several possible embodiments of focused light based component alignment systems. One of these embodiments, shown in FIG. 8 of the '093 Patent, uses a row of laser diodes with sharply focused beams and a detector array with a detecting diode corresponding to each laser diode. The component is rotated until the number of diodes detecting laser light is maximized. This aligns the faces of the body of the component parallel to the sides of the frame around the measurement space.

U.K. Patent Number 2,183,820, entitled Electronic Component Placement, describes an alternative optical system for aligning a component based on the shadow that it casts. The system in the '820 Patent uses two perpendicular light sources each with a corresponding array detector. When the machine is in the process of picking up the component, the machine waits until a shadow from the component is detected. If a component is not detected by the system, the system will try another attempt to pick up the component with up to three attempts made. To correctly orient the component, the component is rotated until the shadow cast on the first detector begins to lengthen. Rotation is then reversed until the shadow begins to lengthen again. Rotation is stopped when the component has its narrowest dimension oriented in a specific direction.

U.S. Pat. No. 5,278,634, assigned to one of the assignees of the present invention, entitled A High Precision Component Alignment Sensor System, incorporated herein by reference, discloses a non-contact, laser-based alignment sensor located on a placement head. The sensor is utilized to generate the correct angular orientation of the component for placement. The sensor also determines any offset in the X-Y plane of the center of the component with respect to the vacuum quill, which carries the component to the circuit board, to allow lateral alignment of the component. The high speed laser-based system disclosed in the '634 Patent uses a stripe of laser light which is directed horizontally at the component whose alignment is being sensed.

The shadow cast by the component is detected by a linear array detector whose output is analyzed to detect the leading edge and the trailing edge of the shadow. This shadow edge information is analyzed as the component is rotated in the light beam to calculate the proper angular orientation and lateral alignment of the component. The procedure described in the '634 Patent involves the rotation of the component until the shadow begins to increase. The shadow cast on the detector is smallest when the component is aligned along the light path. For determining the orientation of fine pitch components with their correspondingly smaller error tolerances, the component is then rotated at a slower speed in the opposite direction to obtain the proper alignment.

Copending U.S. patent application Ser. No. 08/289,279 (hereinafter the '279 Application), filed Aug. 11, 1994, assigned to one of the assignees of the present invention, entitled High Precision Component Alignment Systems, incorporated herein by reference, discloses the use of several different optical systems with collimating lenses, condenser lenses, cylinder lenses and telecentric lens systems, in a manner in which substantially more of the light from the light source compared with the systems in the '624 Patent is directed past the component and collected for measurement, allowing for a sharper component image on the detector. The use of these optical expedients allows the power requirements on a light source to be reduced by a factor of over one-hundred times over the systems in '624 Patent. With this reduction in required brightness levels, other light sources besides lasers such as light emitting diodes (LEDs) and incandescent bulbs can be effectively used in component alignment. The '279 Application discloses how to determine the orientation of a component from the detector measurements as a function of rotational angle.

Copending application Ser. No. 08/372,567 (hereinafter the '567 Application) filed Jan. 13, 1995, assigned to one of the assignees of the present invention, entitled Method and Apparatus for Electronic Component Lead Measurement Using Light Based Sensors on a Component Placement Machine, incorporated herein by reference, adapts the features of the sensors in the '634 Patent and the '279 Application in a innovative, sophisticated way to obtain accurate measurements on the positions of leads on the component.

For applications where a higher level of quality control is necessary or desired, such a lead measurement system can be used in place of a component (body) alignment system as described in the preceding paragraphs.

The systems described by the '634 Patent, the '279 Application and the '567 Application are well suited to the high accuracy placement of components onto circuit boards. Furthermore, these entire sensing systems can be integrated into the placement head to provide for more rapid component placement. The angular orientation of the component can be achieved with an accuracy of better than 0.03 degrees and lateral positioning of the component and/or the leads can be achieved to an accuracy of better than 0.001 inches. Yet, these systems were not efficiently integrated into the placement head to provide the optimal overall use of the available resources.

A component sensing system that reduced measurement times without significant modifications of existing hardware would find wide application. Moreover, a component sensing system that could commence movement of a component toward the circuit board for placement once the component has been raised to a safe position, yet before the component is raised into position for measurement, would increase system efficiency. Such a system would also optimally use the measurements made to orient the component to determine if the proper component has been correctly picked up by the system. Furthermore, an optimal system would be self checking to alert the operators when maintenance was required.

SUMMARY OF THE INVENTION

The present invention is concerned with improved methods for the placement of circuit board components using component placement machines. These improved methods are advantageously used with focused light based sensor systems. When the sensor is attached to the component placement head, the quill of the component placement head optimally includes a projection or notch at a selected height. As the component is being raised on the end of the quill, the discontinuity on the quill is detected as it passes through the sensor. The height of the discontinuity is selected so that its detection by the focused light based sensor indicate that the component has reached a safe height such that the component placement head can begin motion toward the location for the placement of the component without risk of damage to either the quill or the component.

A second improved method is appropriate for sensors which align components based on the shadows cast by the body of the component. Improved efficiency will result whether these focused light base sensors are mounted on the component placement head or not, although the preferred embodiments will have the sensors attached to the component placement head. The alignment times are reduced without the sacrifice of accuracy by using relatively constant high angular velocity for rotating the component when it is in the light path of the light base sensor. The use of a relatively constant velocity allows for the correction for the time lag in obtaining the orientation of the component. The ability to make this correction allows for the use of relatively high angular velocities without resulting in significant errors.

The alignment of the component based on measurements of either the body or the leads of the component using a sensor employing focused light can provide information related to the dimensions of the component. This information on the dimensions of the component can be compared against known dimensions of the type of component expected to be on the placement head. If the measured dimensions of the component are not within specified tolerances of the known dimensions of the expected components, the component placement head can reject the particular component and thereby avoid a placement error. Therefore, placement errors can be reduced using information already available from the alignment of the component.

The focused light based sensor system is self-inspecting to reduce placement errors and downtime while minimizing the necessary intervention from an operator. Self-inspection is performed by taking measurements with the sensor while no component is in the light path. These unobstructed measurements provide an indication of the performance of the system without the complication of the light beam being blocked partially by the component. These measurements may or may not be made with the quill in the light path as long as the measurements are performed consistently from time to time. Once one of these unobstructed measurements is obtained, the results can be compared against absolute values for the measurements and/or similar measurements made at an earlier time. This comparison will indicate whether the system is performing adequately or whether maintenance is required. The system can be designed to further suggest the type of maintenance required, for example, cleaning, repair, or replacement.

DETAILED DESCRIPTION OF THE PREFERRED EMBODIMENTS

Figure 1:
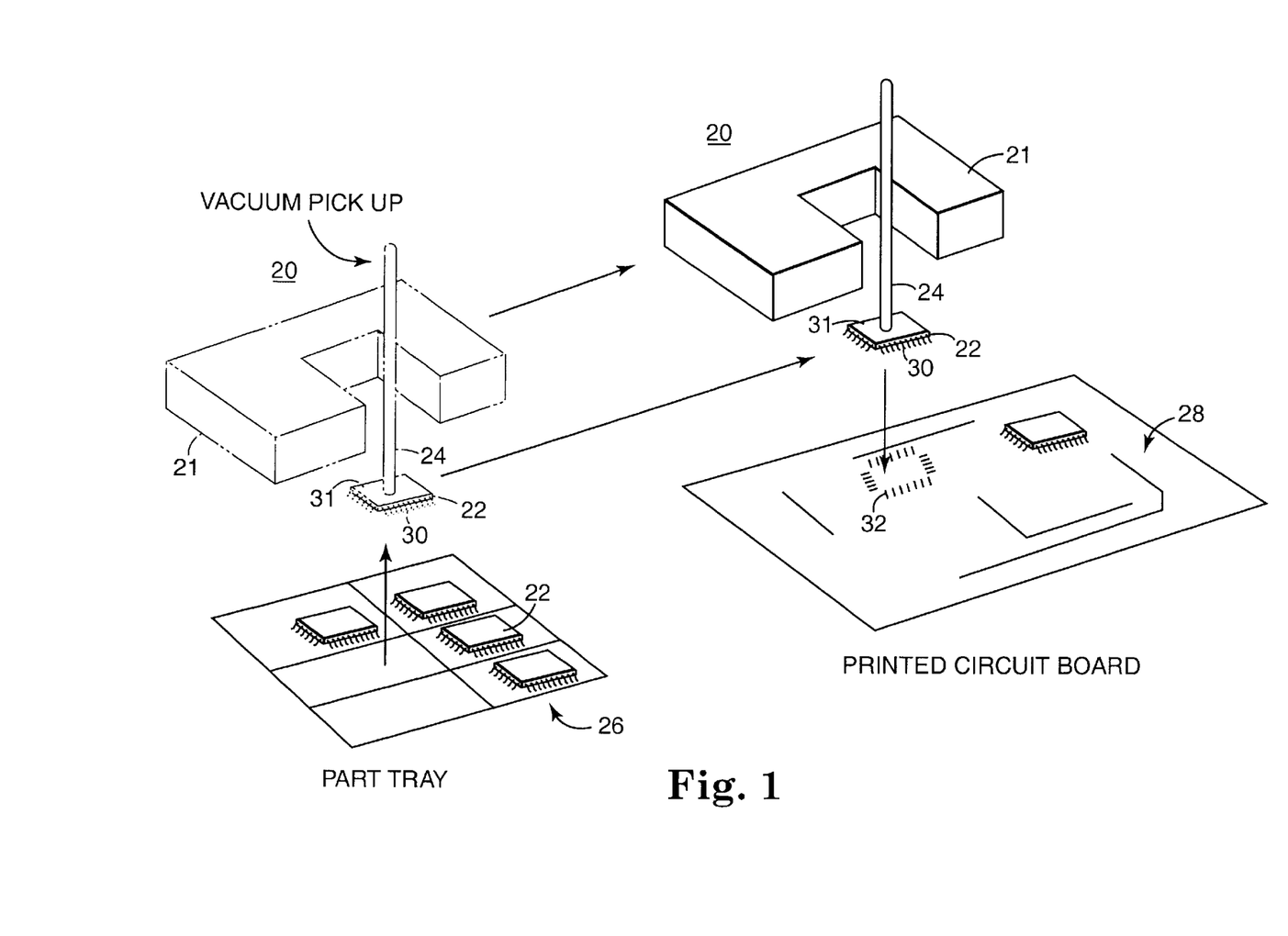
FIG. 1 depicts, in schematic form, a placement head lifting a circuit board component from a parts tray, with arrows depicting the general direction and sequence of movement of the head and part to a circuit board for placement of the component on the board.

Referring to FIG. 1, a portion of the placement head 20 of a typical component placement system is depicted in schematic form in conjunction with a component sensor system 21. The placement head 20 includes a vacuum quill 24 for selectively carrying an electronic component 22. The component 22 has leads 30 and a body 31. With as much speed as possible, the component placement head 20 transports the component 22 from a parts tray 26 to a printed circuit board 28 and precisely places the electronic component 22 in the proper location with its leads 30 precisely placed on the corresponding circuit pads or lines 32 on the circuit board 28. Multiple lead integrated circuit packages are generally made available for placement from a part tray 26 or from a strip of tape (not shown) where they are releasably held or from a tube (not shown).

Figure 2:
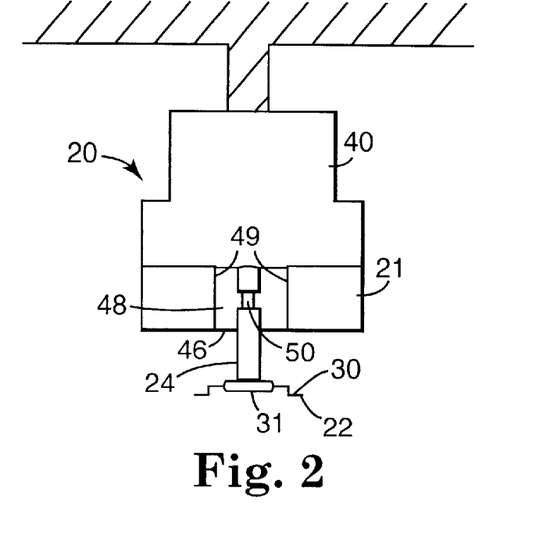
FIG. 2 is a side view of a component placement head.
Figure 3:
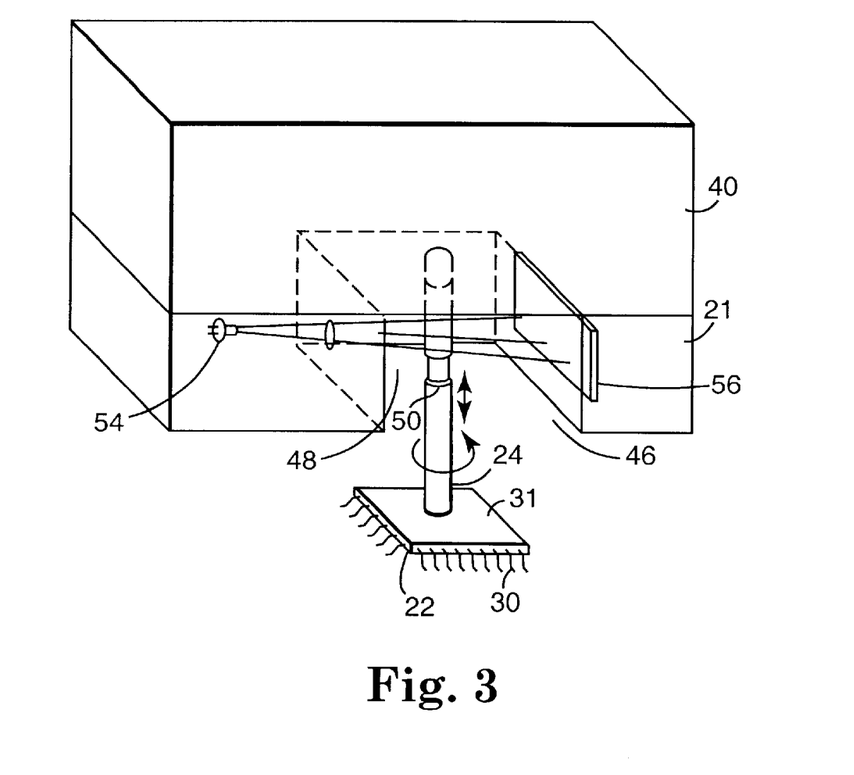
FIG. 3 is a perspective view of a portion of a component placement head in the vicinity of the component sensor system.

Referring to FIG. 2, the component placement head 20 includes a quill adjustment mechanism 40 that may be of conventional design. The quill adjustment mechanism 40 provides for holding the component 22 and rotating and retracting the vacuum quill 24. These degrees of motion are schematically indicated in FIG. 3. The component sensor system 21 is preferably carried just below the quill adjustment mechanism 40. This arrangement is selected for measurements at faster speeds than systems with a component sensor system not mounted on the placement head 20, without sacrificing accuracy.

The component sensor system 21 has an open space 46 for receiving the quill 24. The quill 24 extends through the space 46 to facilitate retraction of the component 22 into the measurement cavity 48 defined by the interior facing surfaces 49 within the component alignment system 21. The quill 24 has a discontinuity 50 (i.e., projection or notch) in diameter at a preselected height. This discontinuity 50 can be detected by the component sensor system 21 to indicate that the component has been raised to a height at which it would be safe to move the placement head 20 without risking damage to the component 22 or the quill 24 from contact with other portions of the placement system. The height of the discontinuity 50 is appropriately placed to avoid such contact. The exact size and shape of discontinuity 50 are irrelevant as long as it can be easily detected by the component sensor system 21. The discontinuity 50 is preferably cylindrically symetric, so the detection of discontinuity 50 does not depend on the angular orientation of quill 24.

The component sensor system 21 is generally suitable for handling all electronic component sizes with which a surface mount component pick and place machine is conventionally used. Component sensor system 21 generally includes a light source 54 and an array detector 56 as displayed in FIG. 3. Generally, the component sensor system 21 can be of a type designed to align a component 22 by the shadow cast by its body 31 such as described in the '634 patent and the '279 application or of a type designed to align the leads 30 of a component 22 such as described in the '567 application. Appropriate collimating optics (not shown) are selected to be placed between the light source 54 and the detector 56. A person of ordinary skill in the art can select the appropriate optics for sensor system 21 in the context of the specific use. The '634 Patent and the '279 Application describe several choices for the optics in the system.

Figure 4:
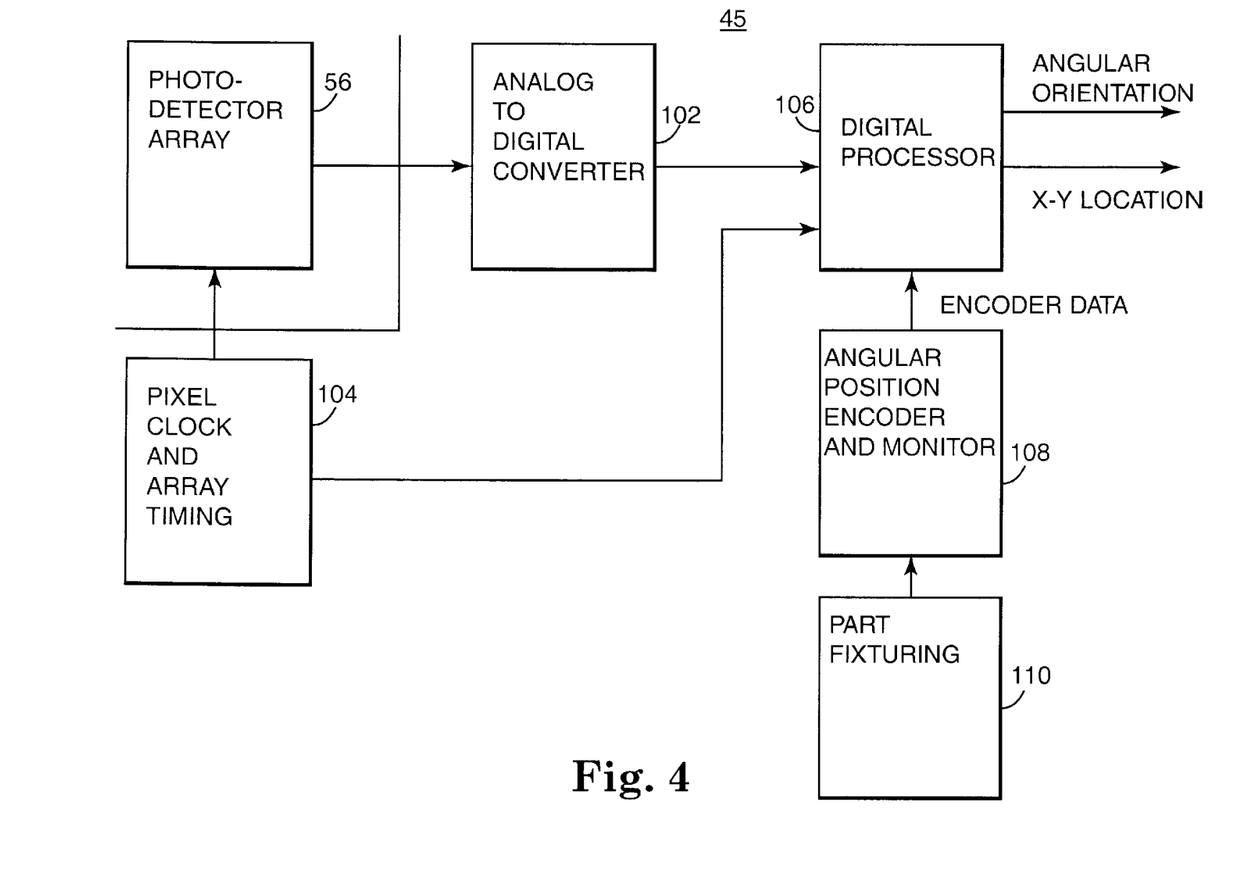
FIG. 4 is a block diagram depicting the interconnection of the processing system of the component detection system, detector array, the quill adjustment mechanism and the controller of the component placement machine.

Referring to FIG. 4, the detector array 56 is connected to a processing system 45. The processing system 45 has an analog-to-digital converter 102 which receives the output from the detector array 56 and sends a digital signal to a digital processor 106, for example an Intel 286 processor. Pixel clock 104 provides the timing information needed by the detector array 56 and the digital processor 106. Digital processor 106 optionally receives input from an angular position encoder and monitor 108 to determine the angular orientation and vertical position of quill 24. Angular position encoder 108 receives information on part fixturing 110 from quill adjustment mechanism 40. Output of the digital processor 106 to the component placement machine 20 indicates the X-Y location and the orientation of the component 22. The elements of the processing system 45 may or may not be on the placement head 20. Preferably, at least the analog to digital converter 102 and the clock 104 are located on the placement head 20.

The present invention focuses on more efficient methods of using component sensor systems 21. To make optimal use of these systems 21, the discontinuity 50 on the quill 24 is added. The improved methods pursuant to the invention result in more rapid alignment of the component 22 without sacrificing accuracy, and also contribute to the proper maintenance of the system 21 over time.

Figure 5A:
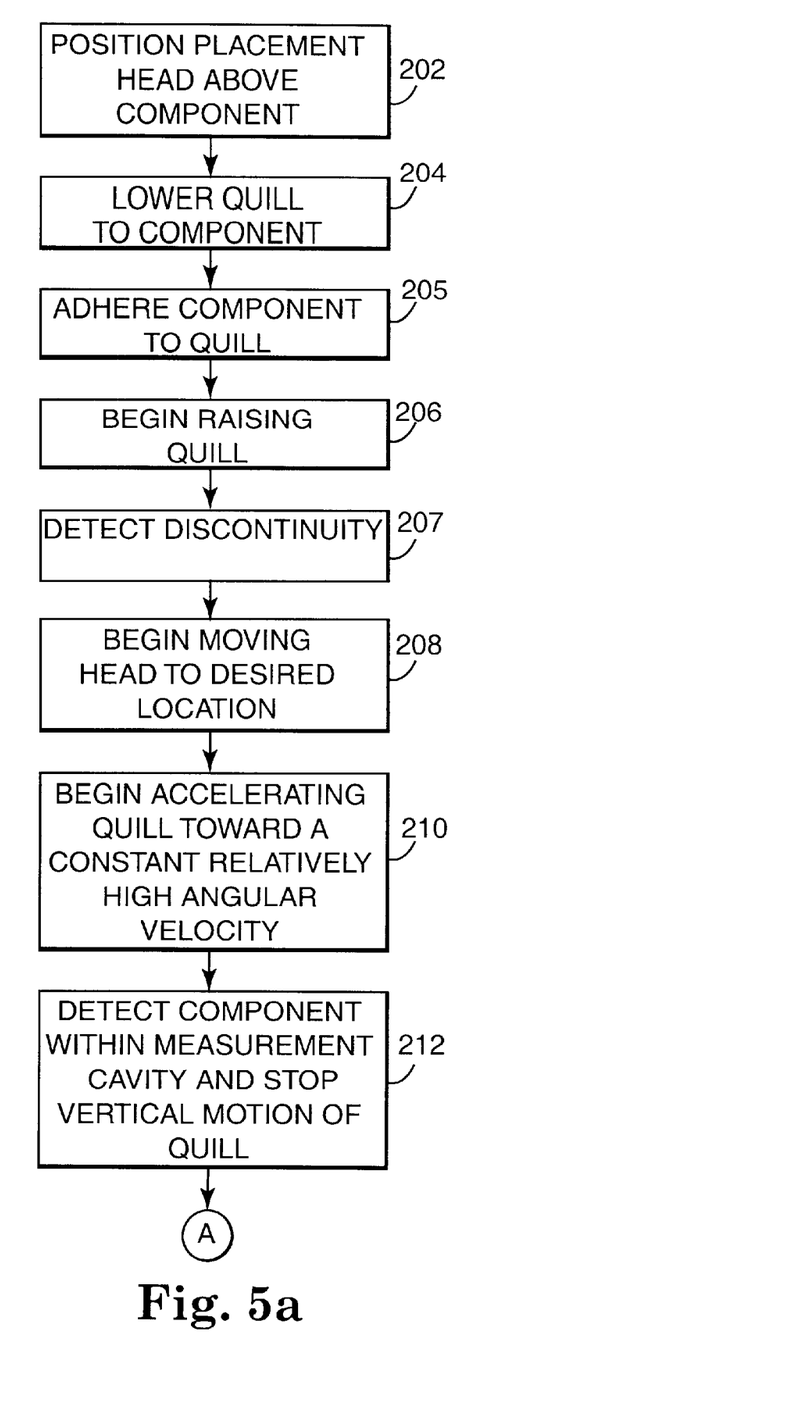
FIG. 5a is a flow diagram schematically indicating the procedure for raising a component into a measurement cavity on a placement head and detecting a quill discontinuity to indicate that safe movement of the head can take place.

FIG. 5a displays a flow chart outlining the improved procedures for raising of the component 22 into the measurement cavity 48 when the component sensor system 21 is mounted on the placement head 20. First, the placement head is positioned 202 above the desired component 22 in a part tray 26 or other suitable area where the components 22 are dispensed. The quill 24 is lowered 204 to the component 22 and the vacuum is applied to adhere 205 the component 22 to the quill 24. The quill adjustment mechanism 40 begins to raise 206 the quill 24. The component sensor system 21 detects 207 the quill discontinuity 50 in the light path between the light source 54 and the detector 56. The detection of the discontinuity 50 indicates that the quill 24 has been raised to a safe level for moving the placement head 20 without risking damage to the component 22 or the quill 24.

After the detection of the discontinuity 50, the placement head 20 starts to move 208 to the proper location for placing the component 22. The use of the discontinuity 50 to signal that it is safe to move the placement head 20 allows for more rapid placement of the component 22 since the placement head 20 does not have to wait until the component 22 is in or almost in the measurement cavity 48 to begin moving. For systems where the component body 31 is measured by the component sensor system 21, the rotation of the component 22 is preferably started 210 before the component 22 is in measurement cavity 48 such that the component 22 will reach a relatively high, constant angular velocity by the time the component 22 is at the proper height or shortly thereafter. When the component 22 is detected 212 at the correct height for alignment, the vertical motion of the quill 24 is stopped.

Figure 5B:
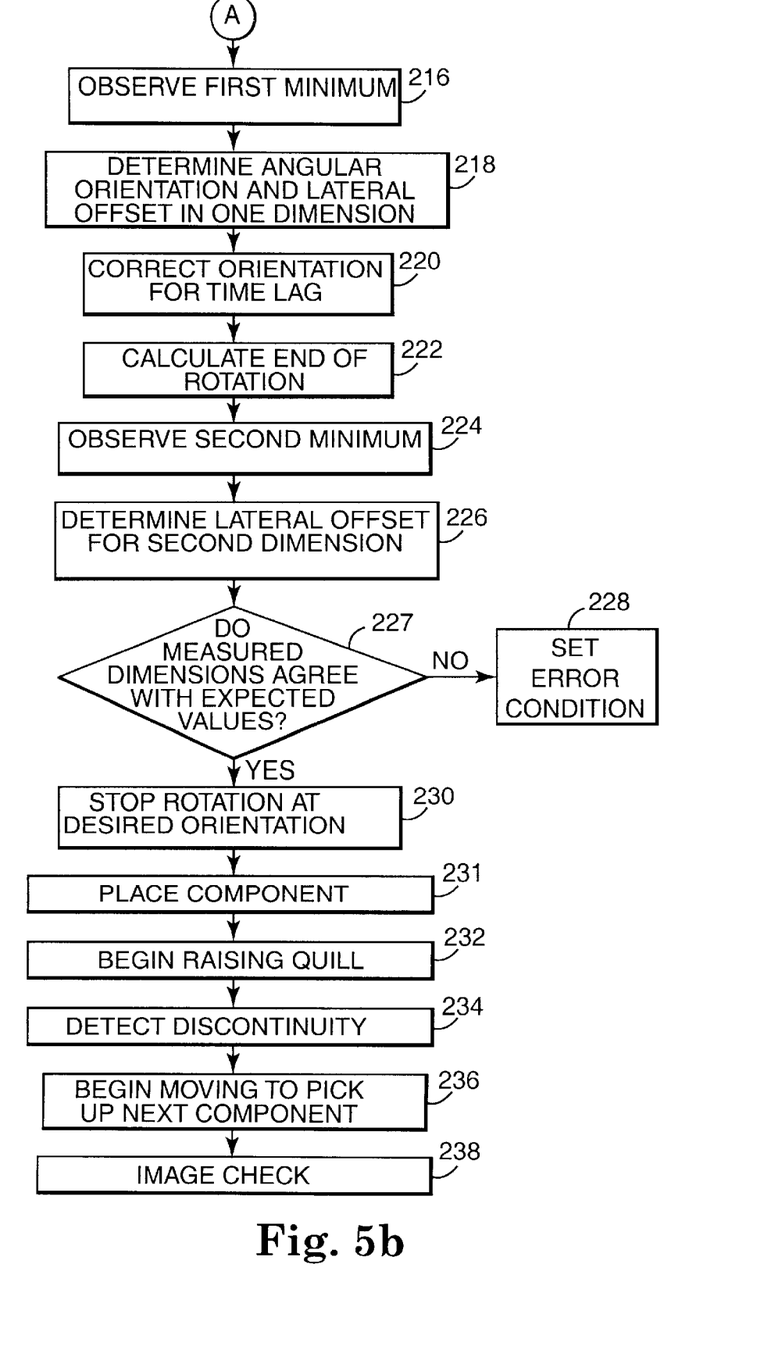
FIG. 5b is a flow diagram schematically indicating an improved procedure for aligning a component body.

FIG. 5b outlines improved measurement procedures specific for a component sensor system 21 designed to detect the shadow cast by a component body 31 such as described in the '634 patent and the '279 application. While it is preferred to have the component sensor system 21 on the placement head 20, the procedures in FIG. 5b provide relatively shorter measurement times regardless of the location of the component sensor system 21. It is preferable that the component is already rotating at a constant, relatively high angular velocity by the time it has reached the proper height in the measurement cavity 48.

For rectangular components 22, a determination of alignment can be made after somewhere greater than about a 90° rotation of the component 22. The exact amount of rotation needed will depend on the configuration of the system and the acceleration and deceleration times. It may be desired to orient the light path at an angle to decrease the amount of rotation needed. As the component is rotated, a first minimum shadow width is observed 216.

After ignoring a minimum passed during the period of acceleration, the first minimum observed usually will correspond to a measurement with the light beam blocked by the narrow dimension of the component 22. Measurements near this first minimum are used to determine 218 the angular orientation of the component 22, the lateral offset for that side and one dimension of the component 22. It is preferable to use the narrow dimension of the component to determine the orientation since the long sides of the component are typically straighter than the short sides of the component and since a longer lever arm magnifies the effect of rotation.

The orientation is corrected 220 for the time lag. The exact causes for the time lag are not known, but they include encoder read out lag and the effect from residual charge on the detector from previous images. Once the orientation of the component 22 is determined, calculations can be performed 222 of final placement angle to properly align the component. After 90° of further rotation, a second minimum in shadow width is observed 224. Measurements at the second minimum are used to obtain 226 the lateral offset for the second dimension of the component 22 and the width of the component 22 in this second dimension.

The measured dimensions of the component 22 are compared 227 with the expected dimensions. If the results disagree beyond a specified tolerance, an error condition is set 228. The system can be designed to respond in various ways to the error condition. The system can be stopped and the operator notified that an error condition has been set. Alternatively, the system can continue to place the component as well as it can while providing some notification that the circuit board 28 under construction may have an improperly placed component 22. Most preferably, the component is discarded and another is selected after the error condition is set.

The rotation is stopped 230 with the component in the desired orientation. The deceleration period will typically take many degrees of rotation before the component is actually stopped. With the component 22 at its proper orientation, the component is placed 231 at the correct location on the circuit board 28 adjusting for the measured lateral offsets. With the component placed, the quill adjustment mechanism 40 begins to raise 232 the quill 24. When the discontinuity 50 on the quill 24 is detected 234, the placement head 20 begins to move 236 to pick up the next component. At this point in time the image quality can be checked 238 without a component in the light path, as further described below. This procedure can be adjusted for non-rectangular components such as a round capacitor.

The use of a constant relatively high angular velocity provides for the accurate alignment of the component in considerably less time. The constant, relatively high angular velocity is preferably on the order of 3500°/s (about 60 radians/s). Previous methods required the very slow rotation of components 22, especially for components with fine tolerances, to minimize errors resulting from the time lag. Since the angular velocity was often changing, it was impossible to determine an accurate correction for the lag. The use of a constant, relatively high angular velocity allows for the correction of the alignment to yield very accurate values while the alignment is very rapidly determined.

The determination of the orientation of the component yields useful information including the X-Y location of the component 22 on the quill 24. This information is given to the placement head 20, so adjustments can be made in the placement of the component. This information is obtained whether the body 31 or the leads 30 of the component are measured. In determining the X-Y position of the component 22, the dimensions of the component 22 are inherently obtained. Placement errors can be reduced if this information on the component 22 is used to check against the known dimensions of the type of component 22 being placed to verify that the component 22 on the quill 24 is the correct component 22. This determination can be made very quickly by the existing processors in the component placement head 20 once processor 106 transfers the dimensional information to the component placement head 20. Improper components or components that were improperly picked up, e.g., components picked up on their side by quill 24 are rejected if they will not have the proper dimensions.

The proper functioning of the component sensor system 21 is important for the proper placement of components 22. Therefore, it would be desirable to minimize errors of the sensor system 21 and at the same time to minimize down time and performance review. The present invention provides regular self-examination (image check) by the component sensor system 21, so the operator can be notified of any maintenance that will be required.

To obtain information on the condition of the system 21, a measurement is taken while no component is in the light path. Depending on the exact procedure used to make the measurements, it may be convenient to have the quill 24 in the light path between the light source 54 and detector 56 or not. The only important consideration is that the "empty" measurements are made consistently each time they are made.

The frequency in which these "empty" measurements are made can be selected to balance the risk of using an error prone component sensor system 21 with the time required to perform the measurements. For example, the "empty" measurements can be made after the placement of each component 22, as described above, or once a day. This frequency can be adjusted after the component sensor system 21 has received sufficient use. Some or all of these "empty" measurements will be stored for later reference. The length of time the measurements are stored will depend on many factors including the amount of memory available and the algorithms used to determine if maintenance is required.

When an "empty" measurement is made, the measurements obtained will reflect the performance of the light source 54, the detector 56, the optics (not shown) and the associated electrical components. The "empty" measurements can be compared with previous "empty" measurements and/or absolute quantities. For example, if minimal (absolute) values are not measured by the detector 56, the operator can be notified that the system 21 has failed and requires immediate maintenance.

In addition, the "empty" measurement can be compared with earlier "empty" measurements to determine if the measurements are changing significantly over time. An appropriate time frame to compare the measurements can be selected based on the prior experience with the maintenance requirements of the particular system. A certain degradation in the measurements can cause a signal that maintenance is required or will be required in the immediate future. The rate and the amount of the degradation of the signal with time can be used to recommend a particular type of maintenance to the operator, such as cleaning, restoration or replacement. The specific procedure for determiing the performance of the system based on the "empty" measurements can be selected by the operator based on their experiences with the specific sensor 21.

Four novel methods have been described above relating to (1) movement of a placement head 20 while a component 22 is being raised, (2) the rapid, accurate alignment of a component body 31 from the rotation of the component at a constant high angular velocity, (3) a determination if the proper component 22 is being placed and (4) the self-evaluation of the component sensor system 21. These novel methods would preferably all be used together. It is certainly possible, though, to select any one of these novel methods to be combined with existing methods while still obtaining benefit from the novel method incorporated into the operation of the component placement head 20. As noted above, a couple of the novel methods are only applicable to certain types or placements of the component sensor system 21.

We claim:

1. A method for determining alignment of a component, the component having a body and being carried by a component placement machine having a vacuum quill, the method comprising:

picking up the component with the quill;

projecting light along a light path;

providing a detector array in the light path;

retracting the component within the light path so that the body of the component casts a shadow onto the detector array;

rotating the component at a substantially constant, relatively high speed substantially as the component enters the light path;

detecting a length defined by edges of the shadow cast upon the detector array as a function of the rotation of the component while the component is being rotated at the substantially constant, relatively high speed; and determining angular orientation of the component on the quill from the dependence of the length from the shadow on the rotation of the component.

2. The method of claim 1, wherein the component placement machine further comprises an angular encoder and wherein the determination of the orientation of the component is corrected for any time lag.

3. The method of claim 1, further comprising continuing the rotation of the component to determine lateral position of the component on the quill and dimensions of the component.

4. The method of claim 3, wherein the determined dimensions of the component are compared with expected dimensions of the component.

5. The method of claim 4, wherein the component placement machine further comprises an angular encoder and wherein the determination of the orientation of the component is corrected for any time lag.

6. The method of claim 1, further comprising ending the rotation at a desired angular orientation of the component determined from the measured orientation of the component.

7. The method of claim 1, wherein the constant, relatively high speed is about 3500°/sec.

8. A method for determining alignment of a component, the component having a body and leads and being carried by a component placement machine having a vacuum quill, the method comprising:

picking up the component with the quill;

projecting light along a light path;

providing a detector array in the light path;

retracting the component within the light path so that a portion of the component casts a shadow onto the detector array;

rotating the component at a substantially constant high angular velocity;

determining particular dimensions connected with the component from the dependence of the shadow on the rotation of the component while the component is being rotated at the substantially constant high angular velocity; and comparing the determined dimensions with known, nominal dimensions expected for the component;

whereby it can be determined if a proper component was picked up by the quill and if the component is properly positioned on the quill.

9. The method of claim 8, wherein the portion of the component casting the shadow includes the body of the component, the method further comprising detecting edges of the shadow cast upon the detector array as a function of the rotation of the component, wherein the particular dimensions are obtained from minima of the shadow resulting from the rotation of the component.

10. The method of claim 9, wherein the rotation is essentially at a constant velocity.

11. The method of claim 8, wherein the portion of the component includes the leads of the component.

12. The method of claim 8, wherein the constant, relatively high angular velocity is about 3500°/sec.

13. A method of determining whether a component sensor system is in need of maintenance, the component sensor system comprising a light source projecting light along a light path and a detector array in the light path, the method comprising:

(a) making present empty measurements with the detector array, by detecting light from the light source on the detector array with no component obstructing the light path, to indicate present performance of the component sensor system;

(b) storing present empty measurements electronically as stored empty measurements;

(c) comparing at least one present empty measurement with at least one stored empty measurement or with an absolute quantity; and (d) determining, based on the comparison, whether the component sensor system is in need of maintenance.

14. The method of claim 13, wherein (c) includes comparing at least one present empty measurement with at least one stored empty measurement and (d) includes determining that the component sensor system is in need of maintenance if at least one present empty measurement differs significantly from at least one stored empty measurement.

15. The method of claim 13, wherein (c) includes comparing at least one present empty measurement with a minimal absolute quantity and (d) includes determining that the component sensor system is in need of maintenance if at least one present empty measurement deviates from the minimal absolute quantity.

16. A method of moving a component, the component having a body, using a component placement head comprising a light source with light from the light source following a light path, a light sensitive detector in the light path and a vacuum quill positioned in the light path to cast a shadow on the detector, where the vacuum quill includes a discontinuity in its width at a selected height, the method comprising:

picking up the component with the vacuum quill;

retracting the quill with the component;

measuring the shadow of the quill as the quill is retracted;

determining when the discontinuity in the width of the quill has entered the light path; and safely beginning lateral motion of the component placement head after the discontinuity has been detected.

17. The method of claim 16, further comprising continuing to retract the quill with the component until the component is in the light path such that the component casts a shadow onto the detector.

18. The method of claim 17, the component placement head including a measurement cavity, the method further comprising determining that the component is in the measurement cavity from the detection of the shadow on the detector.

19. A component placement head for transporting a component to a work piece for placement of the component on the work piece, the component placement head comprising:

a quill selectively movable along a path of travel for picking up and raising the component, the quill including a quill body and a quill discontinuity at a selected position along the quill body;

means operably coupled to the quill for raising the quill;

an optical component sensory system oriented relative to the quill to measure the quill body, the optical component sensory system being constructed to detect the quill discontinuity when the quill discontinuity is at the proper position to be measured by the optical component sensor system and to indicate when the component placement head may begin safe lateral motion.

\* \* \* \* \*

UNITED STATES PATENT AND TRADEMARK OFFICE
CERTIFICATE OF CORRECTION

PATENT NO. : 6,400,459 B1  
DATED : June 4, 2002  
INVENTOR(S) : Carl E. Haugan et al.

It is certified that error appears in the above-identified patent and that said Letters Patent is hereby corrected as shown below:

<u>Title page,</u>  
Item [54], Title, "REPLACEMENT" has been changed to -- PLACEMENT --.

<u>Column 3,</u>  
Line 52, -- the -- has been inserted before "'624".

<u>Column 4,</u>  
Line 43, -- will -- has been inserted before "indicate".

Signed and Sealed this

Twenty-ninth Day of October, 2002

Attest:

Attesting Officer

JAMES E. ROGAN  
Director of the United States Patent and Trademark Office